United States Patent [19]

Fitzpatrick et al.

[11] Patent Number: 4,625,311
[45] Date of Patent: Nov. 25, 1986

[54] PROGRAMMABLE ARRAY LOGIC CIRCUIT WITH TESTING AND VERIFICATION CIRCUITRY

[75] Inventors: Mark E. Fitzpatrick; Cyrus Y. Tsui, both of San Jose; Andrew K. Chan, Milpitas; Albert L. Chan, San Jose, all of Calif.

[73] Assignee: Monolithic Memories, Inc., Santa Clara, Calif.

[21] Appl. No.: 621,536

[22] Filed: Jun. 18, 1984

[51] Int. Cl.$^4$ ............................................. G01R 15/12
[52] U.S. Cl. ...................................... 371/15; 371/21; 371/25; 324/73 R
[58] Field of Search ............................ 371/15, 21, 25; 324/73 R, 73 AT, 73 PG; 365/201

[56] References Cited

U.S. PATENT DOCUMENTS

| | | | |
|---|---|---|---|
| 4,460,982 | 7/1984 | Gee et al. | 371/21 |
| 4,461,000 | 7/1984 | Young | 371/21 |
| 4,488,267 | 12/1984 | Harrison | 371/21 |
| 4,503,387 | 3/1985 | Rutledge et al. | 371/21 |
| 4,503,538 | 3/1985 | Fitz | 371/21 |

Primary Examiner—Michael R. Fleming
Attorney, Agent, or Firm—J. William Wigert, Jr.

[57] ABSTRACT

A field programmable array logic circuit is described wherein existing sensing circuitry is employed along with circuitry to enable every fuse location to be isolated, so that both a.c. and verification testing takes place under the same conditions, i.e. voltage levels and frequency, which occurs during normal operation of the programmed circuit.

7 Claims, 3 Drawing Figures

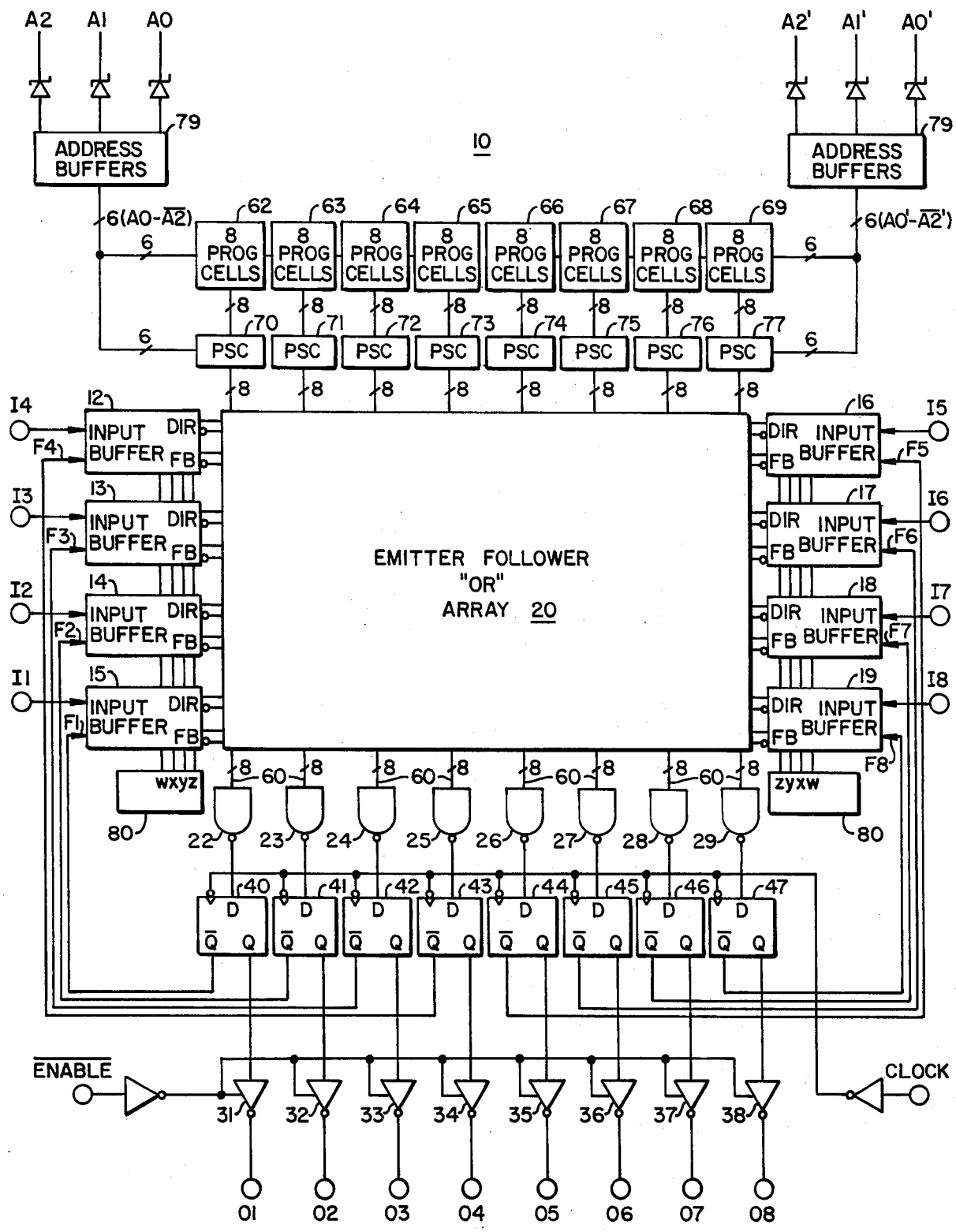
FIG._1.

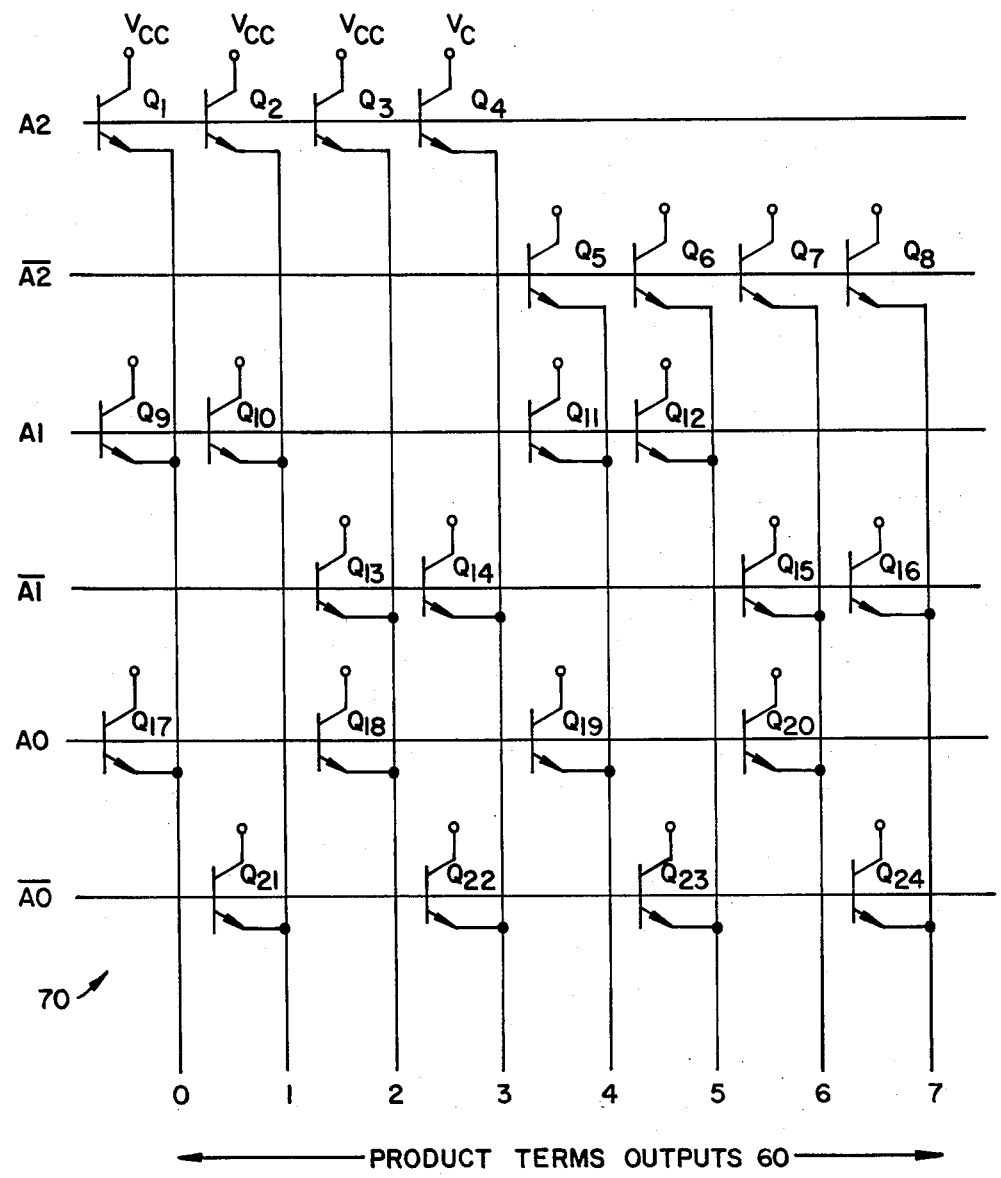
FIG._2.

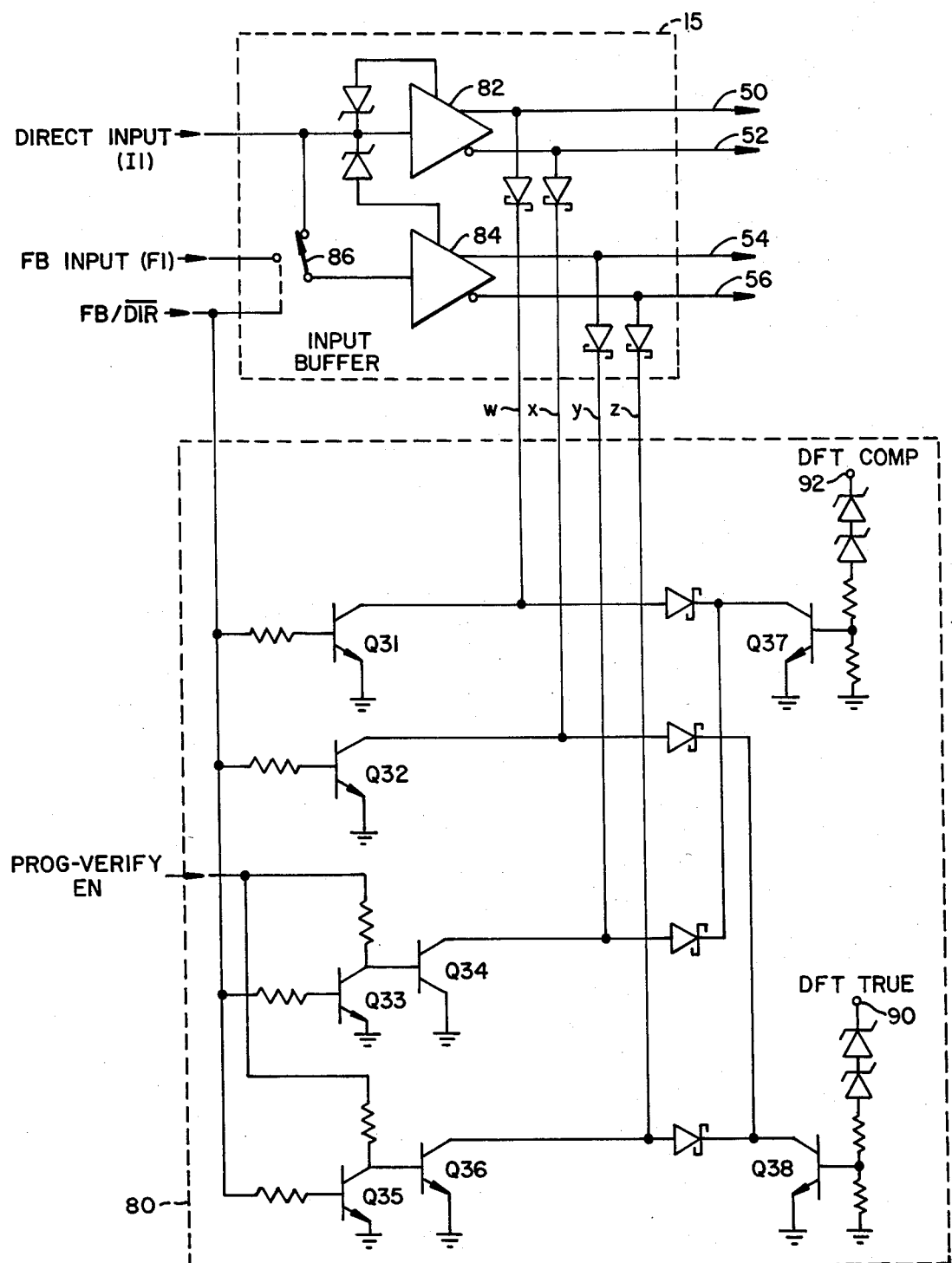
FIG._3.

PROGRAMMABLE ARRAY LOGIC CIRCUIT WITH TESTING AND VERIFICATION CIRCUITRY

DESCRIPTION

1. Technical Field

This invention relates to field programmable logic arrays and in particular to field programmable array logic circuits with improved testing and verification circuitry.

2. Background Art

Fusable links used in bi-polar PROMS (Programmable Read Only Memories) have given the digital systems designer the ability to "write on silicon." In little more than a few seconds, an algorithm, a process, or a boolean transfer function can be permanently provided in the regular structure of an integrated circuit (IC) read only memory (PROM).

PROMs are useful for many purposes including microprogram stores for high speed processors and controllers, non-volatile program stores for minicomputers and microprocessors, and high speed character generation and look up tables.

More recently, programmable integated circuits have been extended to logic circuit arrays. These are sometimes referred to as PLAs (Programmable Logic Arrays) and FPLAs (Field Programmable Logic Arrays). FPLAs, in contrast to earlier mask-programmable circuits, can be programmed away from the place they are manufactured. Any problems in a programmed design that are discovered can be corrected simply by programming a new FPLA and discarding the old one. If the particular application has high enough volumes to cost justify it, a mask can be designed subsequently so that mask-programmable arrays can be made.

PLAs are used in the implementation of random logic networks, data routing, code converters, instruction decoders, state sequences, and a variety of other functions. Typical FPLAs comprise an array of logical AND and OR gates which can be programmed for a specific function. Each output function is the sum (logical OR) of selected products (logical ANDs), or the logical equivalent thereto, where each product is the product of selected polarities of selected inputs.

FPLAs can be programmed so that (1) any input line can be connected to any AND gate input and (2) any of the products (ANDs) can be summed by any of the OR gates. This is accomplished by providing a programmable array or matrix (1) between the circuit inputs and the AND gate inputs and (2) between the output of the AND gates and the inputs of the OR gates, respectively. The FPLA is then programmed by blowing or not blowing the fusible links connecting the conductors of the two arrays much the same way as PROMs are programmed.

A more recent innovation in the programmable array logic circuit which is described in U.S. Pat. No. 4,124,899 and assigned to the same assignee as the present invention. Such devices comprise a single programmable array or matrix of circuit inputs instead on two sets of programmable arrays.

By making the inputs to one gate array programmable, i.e. selectable by the designer, while having the gate inputs nonprogrammable, some design flexibility is sacrificed. However, the reduction in IC chip size more than makes up for the slight reduction in flexibility. Smaller chip size means greater yields and hence lower costs. Smaller chip size also means that smaller, more convenient packaging can be used.

In addition to the basic programmable array logic circuit, other support circuitry is required. For example, programming circuitry is required to blow the fusible links at selected locations. Testing circuitry is required to verify that the correct pattern was blown. Testing circuitry is also needed to test an unprogrammed circuit.

Testing is made more difficult by the fact that, since the output signals are AND-ed signals, it is difficult to examine the product terms because if any input to an AND gate is active (low or zero logic state), the AND gate output is at a zero logic state. Therefore if an output line goes active (logic zero) one does not know which product term, or how many product terms, have gone active. This does not cause any problem in the normal functioning of a programmed circuit. Indeed, the AND function is integral to its normal logic operation. It only causes a problem in testing an unprogrammed circuit and in verifying that the logic array circuit, after programming, is correct.

Existing programmable array logic circuits utilize separate sensing circuitry to verify whether or not the proper fusible links were blown, in order to overcome these problems. That is, instead of utilizing the sensing circuitry which is already in the device and which is operable to sense the state of the output lines from the logic array, totally independent sensing circuitry is employed. In one actual embodiment the programming circuitry is used to provide this function. The underlying philosophy has been to put the line being tested into a disabled or non-operational mode and then testing it under conditions not normally found in the operation of the circuit after it is programmed.

This approach results in unreliable testing since testing does not occur at conditions which occur in a typical user application of the circuit. A.C. speeds from input to output simply cannot be measured on an unprogrammed part with the result that some circuits, after programming, do not meet these speeds. Furthermore, because these circuits rely on sensing circuitry different from that used under normal operation of the circuit to verify that a given fuse location was blown or not, it is possible under certain conditions that a part that tests satisfactorily before programming will not function at all after programming, much less at high speeds.

DISCLOSURE OF THE INVENTION

It is therefore an object of the invention to provide an improved programmable logic array circuit.

Another object of the invention is to provide an improved field programmable array logic circuit which can be accurately tested both before and after programming.

Another object of the invention is to provide an improved programmable array logic circuit which can be tested under conditions nearly identical with those the circuit encounters under field conditions.

Another object of the invention is to provide verification and dynamic testing of a programmable array logic circuit utilizing existing logic array sensing circuits.

In accordance with the present invention a field programmable array logic circuit is provided having means for verifying whether the proper fusible links of a logic array have been properly blown utilizing existing logic array circuitry. Verification is accomplished using the same sensing circuitry which, under actual circuit operating conditions is used to sense the logical state of the outputs of the programmable logic array matrix of the circuit.

This is accomplished by disabling all of the output lines or all of the output lines within subgroups of output lines, from the programmable logic array except one output line being tested. The existing sensing circuit for the single isolated output line is then used to verify if the proper fuses have been blown or not.

In a similar manner, testing of an unprogrammed circuit is accomplished at a.c. speeds and voltages normally encountered by a programmed array logic circuit in use. This is accomplished by isolating a single input line and toggling it at full a.c. testspeeds at normal voltage levels. For example if the logic array matrix is of TTL design, the input line is toggled between TTL voltage levels. The logic states at the output are sensed utilizing the same sensing circuits which are used to sense the logic array during actual circuit operation.

BRIEF DESCRIPTION OF THE DRAWINGS

FIG. 1 is a block schematic diagram of a field programmable array logic circuit in accordance with the present invention.

FIG. 2 is a schematic diagram of the dynamic functional test product select cell circuit of FIG. 1.

FIG. 3 is a schematic diagram of the input line select circuitry of FIG. 1.

BEST MODE OF CARRYING OUT THE INVENTION

FIG. 1 illustrates one example of a programmable array logic circuit 10, in accordance with the present invention. Circuit 10 includes a number of basic functional blocks. The a.c. signal flow path consists of a set of input buffers 12-19, an emitter follower logic gate array 20, a set of sense amplifiers 22-29, and a set of output buffers 31-38, each of which may have its own registers 41-47 respectively. The outputs of the input buffers 12-19, comprise the input lines to the array 20 where they are logically OR-ed with each other in a manner determined by the fusible link pattern.

There are 16 inputs to the input buffers 12-19, eight inputs, I1-I8, which come from outside the circuit 10 and eight inputs, F1-F8, which are feedback inputs from registers 40-47 respectively. Of course, this particular configuration of inputs is intended to be illustrative only and other combinations of inputs can be configured.

Referring additionally to FIG. 2, each input buffer provides 4 input lines to logic array 20: a true input line 50 and a complement input line 52 for direct input I1; and a true input line 54 and a complement input line 56 from feedback input F1.

Thus a total of 32 input lines enter the logic array 20 and each product term, (outputs 01-08), is any arbitrary sum of any of the array 20 input lines, the actual sum being determined by the fuse pattern along that product term. Outputs 01-08 are formed by a direct AND-ing of 8 product terms per output, the eight product terms collectively forming a subgroup 60 of output lines from array 20. These AND functions take place at sense amplifiers 22-29, and are hardwired and not programmable.

So each output 01-08 constitutes a products-of-the-sums of inputs. In the implementation shown here this results by first passing the input signals through a programmable OR-gate array, and then to non-programmable AND gates. It can be shown that logically, such products-of-the sums are equivalent to a circuit which provides as outputs, sums-of-the-products. Indeed, it can be shown that the configuration of FIG. 1 is logically equivalent to a circuit comprising a programmable AND gate array, followed by a fixed OR-gate array, as described in earlier referenced U.S. Pat. No. 4,124,899. The present invention is equally applicable to any such logical equivalent.

Additional circuitry is required for programming and testing of circuit 10. Eight programming circuit cells 62-69, each having eight outputs, provide high current for blowing desired fusible links, in the well-known manner. Additionally eight dynamic functional test (DFT) product select cell (PSC) circuits 70-78 are provided, one for each output 01-08. As will be explained PSC cells 70-78 provide a fundamentally different technique for verifying whether or not a proper fuse pattern has been achieved during programming.

FIG. 2 schmatically illustrates one of the PSC cells, 70. Cell 70 functions as an emitter follower, $\underline{1}$ of 8, product term decoder. It accepts inputs A0, $\overline{A0}$, A1, $\overline{A1}$, A2, $\overline{A2}$, from address buffer 79, used for programming array 20 and decodes them to allow only one product term line, the one selected by the address inputs, to float while the other seven are actively pulled high.

During a verification test after the array 20 is programmed, the current sources in sense amplifier 22 are left on and a product term is selected by applying the appropriate address input. Since only one product term per output can possibly go low, the one "floated" by the PSC 70, the AND-ed output of sense amplifier 22 corresponds to that product term.

For example, suppose the address provided through address buffers 79 is a decimal zero, so product term "0" is to be floated. This means that $\overline{A0}$, $\overline{A1}$, and $\overline{A2}$ are zero, and A0, A1, and A2, are one. Referring to FIG. 2, transistors Q1-Q24 are all NPN so that a zero address turns off the respective transistors and a one address turns them on. It can be seen that for only the case of product term 0 are all of the associated transistors, e.g. transistors Q1, Q9, and Q17 in an off or "floating" state. In the case of all the remaining product term output lines 60 there is at least one transistor which is turned on, with the result that all of the other product term output lines 1-7 are pulled high and disabled.

If a fuse is intact at product term 0, all eight of the product terms will be high and the sense amplifier 22 output will also be low. If a fuse is blown in product term 0, product terms 1-7 will be high, for the reason explained above, and product term zero will be low, causing the sense amplifier 22 to go high. In this manner the same array sensing means, namely sense amplifier 22 that senses the state of the outputs from array 20 during operation of the circuit 10 during its field operation, is used during verification testing.

The input line select circuit 80 of FIG. 1 is shown in greater detail in FIG. 3. If the FB/$\overline{DIR}$, control line is high during program or verify, Q31 and Q32 turn on and pull down the w and x clamp lines to disable the true and complement direct outputs 50 and 52 of input buffer 15. At the same time Q33 and Q35 turn on in the process of turning off Q34 and Q35. This allows the y and z clamp lines to float so as to enable the true and complement feedback outputs 54 and 56 from input buffer 15.

If the FB/DIR, line is low during program or verify, the reverse situation occurs in which the two direct outputs 50 and 52 of the input buffers are enabled and the two feedback outputs 54 and 56 of the input buffers are disabled. Note that Q37 and Q38 are not activated during these procedures. These devices are only activated when the DFT TRUE or the DFT COMP lines, are raised to a super level voltage, approximately 20v, which does not happen during these operations.

The addition of Q37 and Q38 and their associated circuitry allows the disabling of all true or all complement output lines. As will be explained this allows for the disabling of all but one line from input buffer 15.

If at any time the DFT TRUE line is raised at terminal 90 to a zener super level of approximately 20v, Q38 turns on and pulls down the x and z clamp lines to disable both the direct and feedback complement output lines 52 and 56 while leaving the true output lines 50 and 54 active.

If the DFT COMP line is raised at terminal 92 to a zener super level, Q37 turns on and pulls down the w and y lines to disable both the direct and feedback true lines 50 and 54 while leaving the complement output lines 52 and 56 active. Because these lines are only activated by the zener super level and not the normal zener level of approximately 12v, it is possible to tie these lines to input pins already used for other functions rather than adding input pins just for the DFT TRUE and DFT COMP signals.

Operation of the over-all verification and testing circuitry is now described. A product term location for one sense amplifier 22-29 is selected by going into the verify mode and providing an appropriate address input from the AO-A2 address buffer 79. Based upon the address, the DFT product selector circuits 70-77 float 1 of the 8 product terms 60 and pull the rest active high. Seven input buffers are disabled by pulling their direct input lines up to a normal high zener voltage level of 12v, in the well known manner. Since only one input buffer is still active, only four input lines are left. The w, x, or the y, z clamp line pairs go low to disable either the direct 82 or the feedback 84 driver outputs 50 and 52 or 54 and 60 respectively. The FB/DIR control line routes via switch 86 the signal from the input line to whichever driver 82 or 84 is still active. At this point all of the input lines to the selected input buffer are disabled except for one true complement pair.

A verify operation proceeds as follows. Once a single input line is selected, a TTL voltage level is applied to its buffer's direct input. A TTL high selects the true input line and a TTL low selects the complement input line. If a fuse at the selected location is intact, then it will pull up the sense amp current source 22-29 and produce a low at the output thereof. If a fuse at the selected location is blown, the sense amp current source pulls down the product term and produces a high at the output of the sense amplifier. In this fashion the entire array is checked to verify that it has the correct fuse pattern blown in it.

For a.c. testing before the logic array 20 is programmed, the circuit operates as follows. First all input lines except one true complement pair are disabled, as explained above. A 20 v. super zener level is then put at either the DFT TRUE pin 90, to check the true input line, or the DFT COMP pin 92, to check the complement input line. The a.c. test is performed by toggling the selected input buffer 15 input pin at full speed between TTL low and TTL high test levels (0-3 volts) and observing the signals at output pins 01-08 from array 20. As the selected input line goes high the selected product term goes high and the output pin goes high. As the selected input line goes low, the selected product term goes low, because all other input lines are disabled, and the output goes low. By measuring the delay between the input pin and the output pin transitions for each product term/input line combination, one can perform a complete a.c. dynamic functional test on all possible signal paths before providing unprogrammed circuits to a user.

In both the verify and the a.c. test operations, the active signal paths are the same ones that are active, in various combinations, in a typical customer application of a programmed part. Since every path can be tested individually and independently of all others, and since testing occurs with standard circuit voltage signals and frequencies, there is a greater assurance that any chosen combination of these paths will function properly in any arbitrary user application.

The foregoing means that parts used by circuit designers will have a greater assurance of being more fully and accurately tested for high performance. Programming and functional yields as encountered by the user are improved as will a.c. test yields. Furthermore since a.c. speed specifications can be guaranteed through actual testing rather than relying on statistical distributions of small samples, faster a.c. speeds can be guaranteed in the specifications.

We claim:

1. A programmable array logic circuit comprising:
a programmable logic array matrix comprising a first programmable logic array followed by a second logic array;
said matrix including a plurality of input lines and a plurality of output lines;
means for sensing each of the output lines of said logic array matrix to determine the logical state thereof during the operation of the programmed logic circuit;
means for allowing a test signal at selected input lines to pass through said programmed logic array matrix; and
vertification means for utilizing the same sensing means to sense the effect and speed of the test signals to verify if the logic array has been correctly programmed.

2. A programmable array logic circuit as in claim 1 wherein said verification means comprises means for determining the logical state of a single output line under its normal operating conditions while at the same time disabling all of the remaining output lines.

3. A programmable array logic circuit as in claim 2 wherein said sensing means for each output line also performs a logic function to the signals thereon.

4. A programmable array logic circuit comprising:
a programmable logic array matrix comprising a first programmable logic array followed by a second logic array;
said matrix including a plurality of input lines and a plurality of m output lines arranged into n subgroups which are connected together to form n circuit outputs;
means for sensing each of the n circuit outputs to determine the logical state thereof during the operation of the programmed logic circuit;

means for allowing selected test signals at said input lines for passage through said programmed logic array matrix; and verification means for utilizing the same sensing means to sense the effect and/or speed of said test signals to verify if the logic array has been correctly programmed.

5. A programmable array logic circuit as in claim 4 wherein said verification means comprises means for determining the logical state of a single output line within each of the n subgroups under its normal operating conditions while at the same time disabling all of the remaining output lines within each of the n subgroups.

6. A programmable array logic circuit as in claim 5 wherein said sensing means for each output line also performs a logic function to the signals thereon.

7. In a programmable array logic circuit comprising:

a programmable logic array matrix, said matrix including a plurality of input and output lines and including a first programmable logic array followed by a second logic array;

means for providing selected ones of said output lines as feedback lines to said programmable logic array matrix;

a plurality of input buffers, each providing at least four inputs to said logic array matrix, a direct and a feedback input and the logical complement of each;

means for sensing each of the output lines to determine the logical state thereof; and wherein the improvement comprises means for a.c. testing an unprogrammed logic array circuit comprising;

means for disabling all of said input buffers except one;

means for disabling either both true and both complement lines of the single input buffer which is not disabled, thereby leaving only a single unaffected input line to said logic array matrix;

means for applying an a.c. signal to said input buffer resulting in a related a.c. signal to a selected input line, the a.c. signal and the related signal having amplitudes and frequencies substantially identical to that used in operation of the logic array circuit after it is programmed; and means for sensing the output of said logic array circuit to measure the time delay between the time a test signal is applied at the input and when its effect appears at the output to test said logic array matrix.

* * * * *